(12) United States Patent
Nihei et al.

(10) Patent No.: US 12,120,891 B2
(45) Date of Patent: Oct. 15, 2024

(54) PHOTOELECTRIC CONVERSION ELEMENT, PHOTOELECTRIC CONVERSION DEVICE, PHOTOELECTRIC CONVERSION ELEMENT PRECURSOR, LIGHT DETECTION METHOD, AND PRODUCTION METHOD FOR PHOTOELECTRIC CONVERSION ELEMENT

(71) Applicant: JAPAN SCIENCE AND TECHNOLOGY AGENCY, Kawaguchi (JP)

(72) Inventors: Ayumi Nihei, Yokohama (JP); Tsutomu Miyasaka, Machida (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 644 days.

(21) Appl. No.: 17/422,550

(22) PCT Filed: Jan. 30, 2020

(86) PCT No.: PCT/JP2020/003420
§ 371 (c)(1),
(2) Date: Jul. 13, 2021

(87) PCT Pub. No.: WO2020/162317
PCT Pub. Date: Aug. 13, 2020

(65) Prior Publication Data
US 2022/0102656 A1    Mar. 31, 2022

(30) Foreign Application Priority Data

Feb. 8, 2019    (JP) .................................. 2019-021974

(51) Int. Cl.
*H01L 51/42*        (2006.01)
*H10K 30/15*        (2023.01)
(Continued)

(52) U.S. Cl.
CPC ............. *H10K 30/15* (2023.02); *H10K 30/81* (2023.02); *H10K 71/12* (2023.02); *H10K 85/351* (2023.02)

(58) Field of Classification Search
None
See application file for complete search history.

(56) References Cited

U.S. PATENT DOCUMENTS

2017/0294595 A1    10/2017    Kim et al.
2017/0301479 A1    10/2017    Moehl et al.
(Continued)

FOREIGN PATENT DOCUMENTS

JP    2017066096 A    4/2017
JP    2017534179 A    11/2017
WO    2016072092 A1    5/2016

OTHER PUBLICATIONS

Dong et al., High-Gain and Low-Driving-Voltage Photodetectors Based on Organolead Triiodide Perovskites, Advanced Materials, Jan. 21, 2015, vol. 27, pp. 1912-1918.
(Continued)

*Primary Examiner* — William C Trapanese
(74) *Attorney, Agent, or Firm* — Panitch Schwarze Belisario & Nadel LLP

(57) ABSTRACT

A photoelectric conversion element includes a first layer, a second layer, and a third layer that are laminated in this order. The first layer is formed of a plurality of particles including an inorganic semiconductor as a main component, an aggregate of the particles, or a thin film including an inorganic semiconductor as a main component. The second layer is provided on a surface of each of the particles or the aggregate and is formed of a plurality of particles including a perovskite structure as a main component, an aggregate of the particles, or a thin film including a perovskite structure as a main component. The third layer is formed of a plurality
(Continued)

of particles including an organic metal complex as a main component, an aggregate of the particles, or a thin film including an organic metal complex as a main component.

17 Claims, 9 Drawing Sheets

(51) Int. Cl.
    *H10K 30/81*     (2023.01)
    *H10K 71/12*     (2023.01)
    *H10K 85/30*     (2023.01)

(56) References Cited

U.S. PATENT DOCUMENTS

2018/0138101 A1* 5/2018 Yu ................... H01L 23/481
2018/0366277 A1 12/2018 Seo et al.

OTHER PUBLICATIONS

Fu et al., High performance photomultiplication perovskite photodetectors with $PC_{60}BM$ and NPB as the interlayers, Organic Electronics, Sep. 18, 2017, vol. 51, pp. 200-206.

Ishii et al., Sensitive Photodetection with Photomultiplication Effect in an Interfacial $Eu2+/3+$ Complex on a Mesoporous $TiO_2$ Film, ACS Applied Materials & Interfaces, Jan. 22, 2018, vol. 10, pp. 5706-5713.

International Search Report (PCT/ISA/210) with an English translation, and Written Opinion (PCT/ISA/237) mailed on Mar. 31, 2020, by the Japanese Patent Office as the International Searching Authority for International Application No. PCT/JP2020/003420.

Extended European Search Report issued on Oct. 13, 2022, by the European Patent Office in corresponding European Patent Application No. 20751931.5. (9 pages).

* cited by examiner

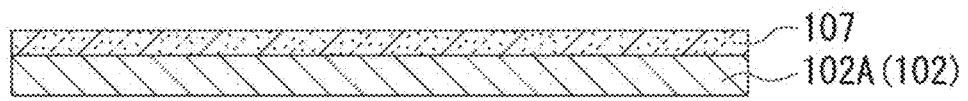
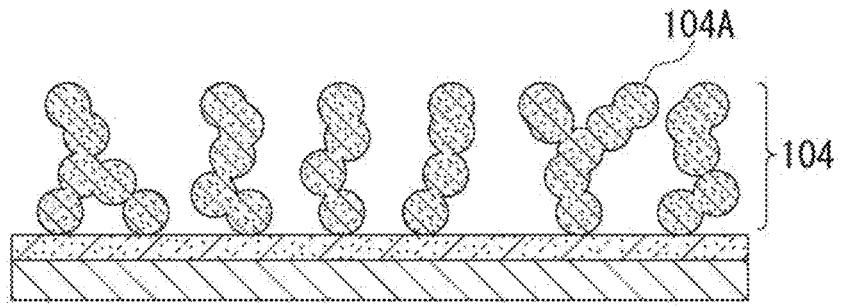
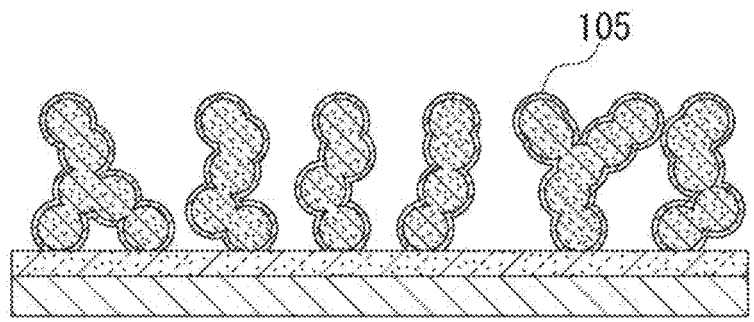
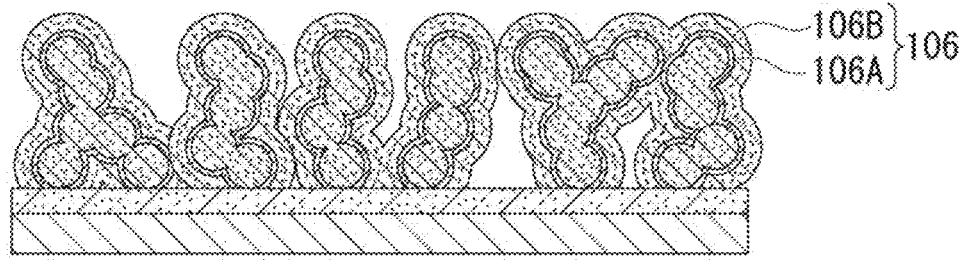
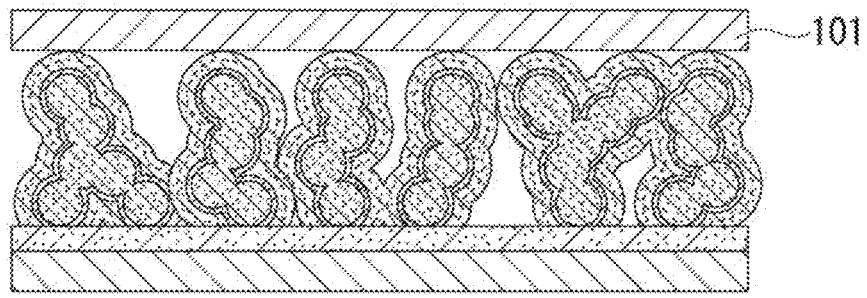

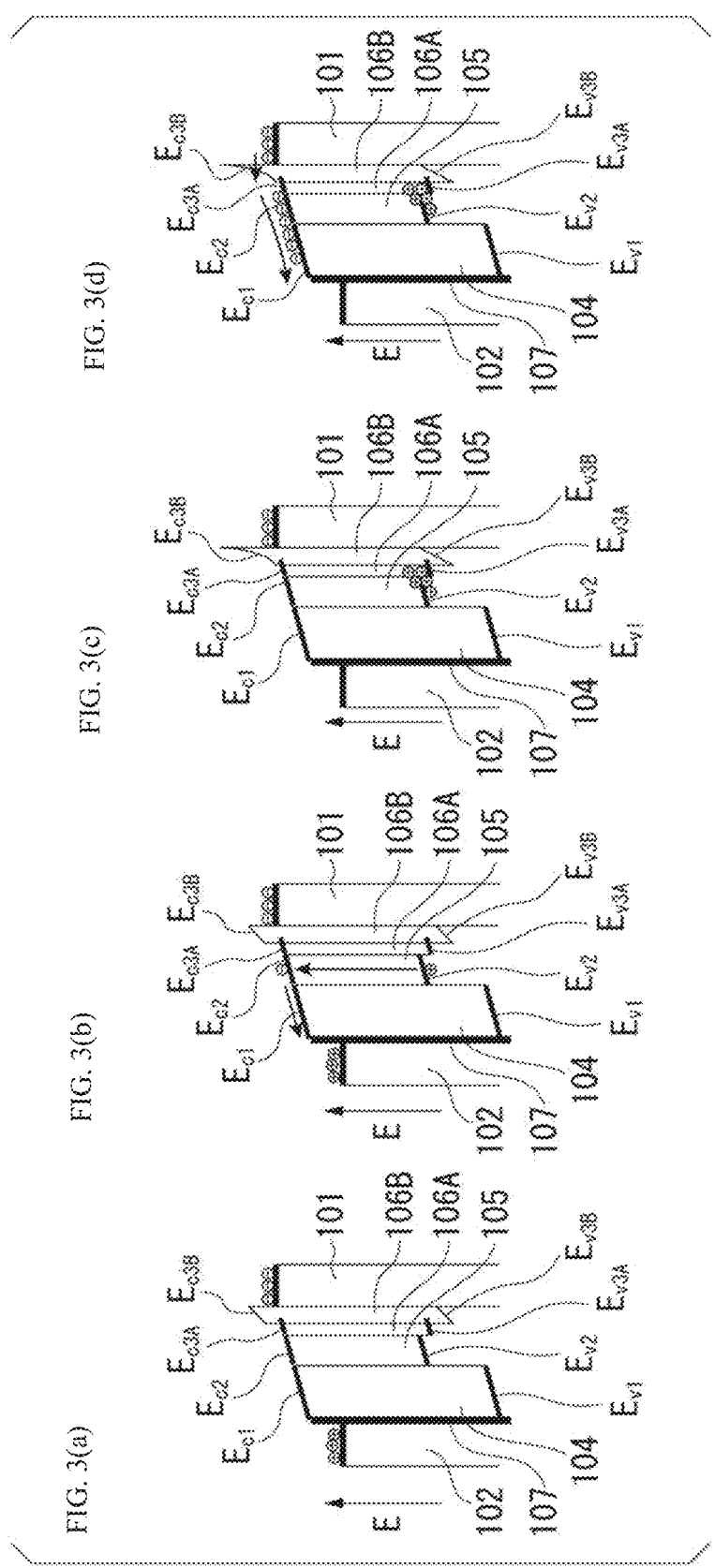

PHOTOELECTRIC CONVERSION ELEMENT, PHOTOELECTRIC CONVERSION DEVICE, PHOTOELECTRIC CONVERSION ELEMENT PRECURSOR, LIGHT DETECTION METHOD, AND PRODUCTION METHOD FOR PHOTOELECTRIC CONVERSION ELEMENT

TECHNICAL FIELD

The present invention relates to a photoelectric conversion element, a photoelectric conversion device, a photoelectric conversion element precursor, a light detection method, a production method for a photoelectric conversion element.

Priority is claimed on Japanese Patent Application No. 2019-021974, filed Feb. 8, 2019, the content of which is incorporated herein by reference.

BACKGROUND ART

A technique of amplifying a photocurrent using a photoelectric conversion element such as an avalanche photodiode or a photomultiplier tube is known. In such an avalanche photodiode, collision of electrons and holes that are generated by irradiating p-n junctions formed of an inorganic semiconductor with light in a state where a reverse voltage is applied with a crystal lattice and generation of electrons and holes from the crystal lattice with which the electrons and holes collide are repeated in a chain reaction to amplify a photocurrent. The photomultiplier tube is configured with a plurality of diodes and a vacuum tube including the diodes, in which collision of electrons generated by irradiating one diode with light with the diode and generation of electrons from the diode with which the electrons collide are repeated in a chain reaction to amplify a photocurrent.

On the other hand, for example, Non-Patent Document 1 discloses a photoelectric conversion element having a hybrid structure of an inorganic material and an organic material. In this photoelectric conversion element, an organic matter is bonded to a surface of titanium oxide through europium, the organic matter is caused to absorb ultraviolet light to generate charge, and a photocurrent is amplified by this charge.

CITATION LIST

Non-Patent Document

[Non-Patent Document 1]
ACS Appl. Mater. Interfaces, 10, 5706-5713 (2018)

SUMMARY OF INVENTION

Technical Problem

In an avalanche photodiode, it is difficult to detect weak light such as visible light. In addition, in a photomultiplier tube, it is known that only an amplification factor of several times to several tens of times can be obtained. In these photoelectric conversion elements, a high driving voltage of 100 V or higher is required, and there is a problem in that a large amount of dark current (noise) is generated.

The photoelectric conversion element disclosed in Non-Patent Document 1 has a function of amplifying a photocurrent while suppressing a driving voltage to a low level. However, response sensitivity is low and it is difficult to detect weak light such as visible light and/or near infrared light.

The present invention has been made in consideration of the above-described circumstances, and an object thereof is to provide a photoelectric conversion element that can respond to a weak light signal with high efficiency, high sensitivity, and high speed while suppressing an environmental load to a low level, a photoelectric conversion device, a photoelectric conversion element precursor, a light detection method, and a production method for a photoelectric conversion element.

Solution to Problem

In order to achieve the object, the present invention adopts the following means.

(1) According to one aspect of the present invention, a photoelectric conversion element is provided, including a first layer, a second layer, and a third layer that are laminated in this order, in which the first layer is formed of a plurality of particles including an inorganic semiconductor as a main component, an aggregate of the particles, or a thin film including an inorganic semiconductor as a main component, the second layer is provided on a surface of each of the particles or the aggregate and is formed of a plurality of particles including a perovskite structure as a main component, an aggregate of the particles, or a thin film including a perovskite structure as a main component, the third layer is formed of a plurality of particles including an organic metal complex as a main component, an aggregate of the particles, or a thin film including an organic metal complex as a main component, in a conduction band, an energy level of the second layer is higher than an energy level of the first layer and an energy level of the third layer is higher than the energy level of the second layer, and in a valence band, an energy level of the second layer is higher than an energy level of the third layer.

Here, it is preferable that, in the valence band, the energy level of the second layer be higher than the energy level of the first layer.

(2) In the photoelectric conversion element according to (1), it is preferable that the second layer be a layer in which an energy difference between the valence band and the conduction band is lower than 3.1 eV.

(3) In the photoelectric conversion element according to (1) or (2), it is preferable that the first layer and/or the third layer be a layer in which an energy difference between the valence band and the conduction band is 3.1 eV or higher.

(4) In the photoelectric conversion element according to any one of (1) to (3), it is preferable that, in the valence band, an energy level difference between the second layer and the third layer be 0.1 eV or higher.

(5) In the photoelectric conversion element according to any one of (1) to (4), it is preferable that the organic metal complex be a complex obtained by forming a coordinate bond between an inorganic transition metal and an organic ligand.

(6) In the photoelectric conversion element according to (5), it is preferable that the organic ligand be a ring heteroatom-containing organic ligand or an acetylacetonate-based organic ligand.

(7) In the photoelectric conversion element according to any one of (1) to (6), it is preferable that the organic metal complex be a complex obtained by forming a coordinate bond between an inorganic transition metal and a nonbonding electron pair of ring heteroatoms in a ring heteroatom-containing organic ligand.

(8) In the photoelectric conversion element according to any one of (5) to (7), it is preferable that the inorganic transition metal be localized on the second layer side.

(9) In the photoelectric conversion element according to any one of (6) to (8), it is preferable that the inorganic transition metal be europium, and the ring heteroatom-containing organic ligand be terpyridine.

(10) In the photoelectric conversion element according to any one of (1) to (9), it is preferable that the inorganic semiconductor be an inorganic semiconductor having an absorption wavelength in an ultraviolet range.

(11) In the photoelectric conversion element according to any one of (1) to (10), it is preferable that the inorganic semiconductor be titanium oxide.

(12) In the photoelectric conversion element according to any one of (1) to (11), it is preferable that the second layer be a thin film, particles, or an aggregate of the particles having a thickness of 1 nm or more and 10 nm or less.

(13) In the photoelectric conversion element according to any one of (1) to (12), it is preferable that the perovskite structure be a compound represented by a compositional formula $CH_3NH_3PbI_3$.

(14) In the photoelectric conversion element according to any one of (1) to (13), it is preferable that the first layer be a layer having an energy level of –8 eV or higher in the valence band and having an energy level of –4 eV or lower in the conduction band.

(15) In the photoelectric conversion element according to any one of (1) to (14), it is preferable that the second layer be a layer having an energy level of –5.5 eV or higher in the valence band and having an energy level of –3 eV or lower in the conduction band.

(16) In the photoelectric conversion element according to any one of (1) to (15), it is preferable that the third layer be a layer having an energy level of –6 eV or higher in the valence band and having an energy level of –2 eV or lower in the conduction band.

(17) According to another aspect of the present invention, a photoelectric conversion device is provided, including the photoelectric conversion element according to any one of (1) to (16), in which a negative electrode layer is laminated on a side opposite to the second layer across the first layer, and a positive electrode layer is laminated on a side opposite to the second layer across the third layer.

(18) According to still another aspect of the present invention, a photoelectric conversion element precursor is provided, including a first layer and a second layer that are laminated, in which the first layer is formed of a plurality of particles including an inorganic semiconductor as a main component, an aggregate of the particles, or a thin film including an inorganic semiconductor as a main component, the second layer is formed of a plurality of particles including a perovskite structure as a main component, an aggregate of the particles, or a thin film including a perovskite structure as a main component, and in a conduction band, an energy level of the second layer is higher than an energy level of the first layer.

(19) According to still another aspect of the present invention, a light detection method is provided, including a step of detecting visible light and/or near infrared light from measurement result of a current flowing by making the second layer in the photoelectric conversion device according to (17) receive visible light and/or near infrared light when a voltage is applied between the negative electrode layer and the positive electrode layer.

(20) According to still another aspect of the present invention, a production method for a photoelectric conversion element is provided, the production method including: a first step of forming a first laminate in which a first layer that is formed of a plurality of particles including an inorganic semiconductor as a main component, an aggregate of the particles, or a thin film including an inorganic semiconductor as a main component is laminated, on a surface of a substrate; a second step of forming a second laminate in which a second layer that is formed of a plurality of particles including a perovskite structure as a main component, an aggregate of the particles, or a thin film including a perovskite structure as a main component is laminated, on an exposed surface of the first layer, and a third step of forming a third laminate in which a third layer that is formed of a plurality of particles including an organic metal complex as a main component, an aggregate of the particles, or a thin film including an organic metal complex as a main component is laminated, on an exposed surface of the second layer.

Here, energy levels of the respective layers in a conduction band are higher in order of the first layer, the second layer, and the third layer, and an energy level of the second layer is higher than an energy level of the third layer in the valence bands of the respective layers.

(21) In the production method for a photoelectric conversion element according to (20), it is preferable that the third step include a step of forming a layer that is formed of a plurality of particles including an inorganic transition metal as a main component, an aggregate of the particles, or a thin film including an inorganic transition metal as a main component on the exposed surface of the second layer and subsequently forming a coordinate bond between the inorganic transition metal in the layer and an organic ligand.

Advantageous Effects of Invention

The present invention can provide a photoelectric conversion element that can respond to a weak light signal with high efficiency, high sensitivity, and high speed while suppressing an environmental load to a low level, a photoelectric conversion device, a photoelectric conversion element precursor, a light detection method, and a production method for a photoelectric conversion element.

BRIEF DESCRIPTION OF DRAWINGS

FIG. 2(a) to FIG. 2(e) are perspective views showing an object to be processed in the process of producing the photoelectric conversion element according to the present invention.

FIG. 3(a) to FIG. 3(d) are diagrams showing an operation principle of the photoelectric conversion element according to the present invention.

FIGS. 11(a) and 11(b) are diagrams (images) showing a result of observing a cross-section of the photoelectric conversion element according to Example 1 of the present invention, in which FIG. 11(a) shows the observation result by a cross-sectional scanning electron microscope (SEM) and FIG. 11(b) shows the observation result by a crystal structure analysis by an X-ray diffractometer (XRD).

FIGS. 12(a) and 12(b) are diagrams (images and charts) showing a result of observing a cross-section of the photoelectric conversion element according to Example 1 of the present invention, in which FIG. 12(a) shows the observation result by a cross-sectional transmission electron microscope (TEM) and FIG. 12(b) shows the observation result by EDS mapping (elemental analysis by an energy dispersive X-ray spectrometer).

DESCRIPTION OF EMBODIMENTS

Figure 1:
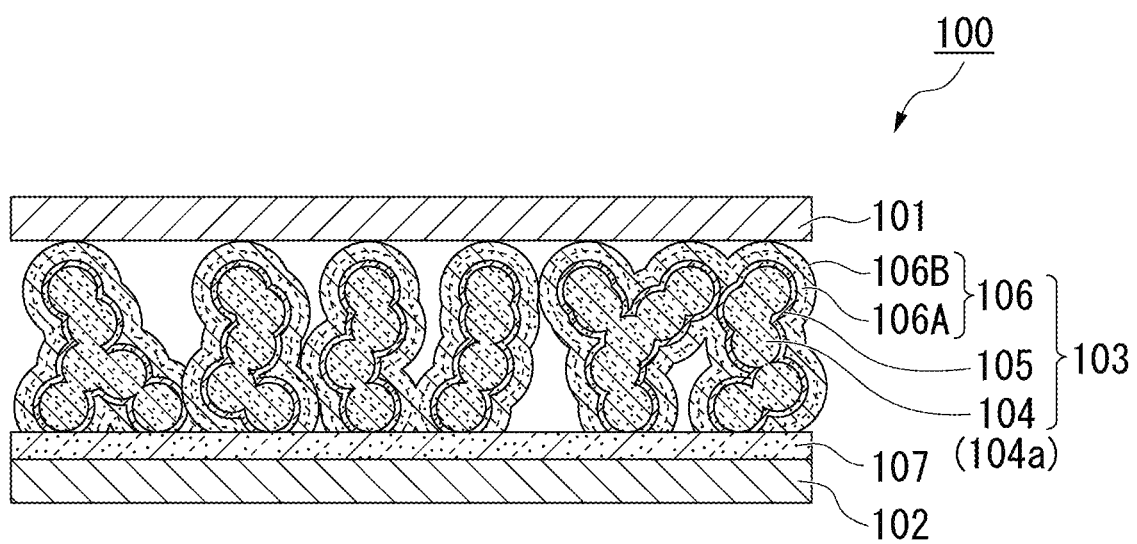
FIG. 1 is a cross-sectional view showing a photoelectric conversion element according to an embodiment of the present invention.

Hereinafter, a photoelectric conversion element, a photoelectric conversion device, a photoelectric conversion element precursor, a visible light detection method, and a production method for a photoelectric conversion element according to an embodiment to which the present invention is applied will be described in detail using the drawings. In the drawings used for the following description, in order to easily understand characteristics, characteristic portions may be enlarged and shown for convenience of description, and a dimensional ratio and the like between the respective components are not necessarily the same as the actual ones. In addition, materials, dimensions, and the like described as examples in the following description are merely exemplary, and the present invention is not limited thereto. Within a range where the scope of the present invention does not deteriorate, appropriate changes can be made.

FIG. 1 is a cross-sectional view schematically showing a configuration of a photoelectric conversion device 100 according to an embodiment of the present invention. The photoelectric conversion device 100 mainly includes a positive electrode layer (positive electrode member) 101, a negative electrode layer (negative electrode member) 102, and a photoelectric conversion element 103 that is interposed between the positive electrode layer 101 and the negative electrode layer 102.

A buffer layer 107 may be interposed between the negative electrode layer 102 and the photoelectric conversion element 103, in which $E_{cb}$ as an energy level of the buffer layer 107 in a conduction band is present between $E_{c2}$ and $E_{c3}$ as energy levels of the negative electrode layer 102 and the photoelectric conversion element 103 in the conduction band (that is $E_{c2}<E_{cb}<E_{c3}$). Examples of a material for forming the buffer layer 107 include europium oxide ($Eu_2O_3$), titanium oxide, and tin oxide.

In order to allow the photoelectric conversion element 103 to receive light, the negative electrode layer 102 may be formed of a material having light-transmitting properties, for example, antimony-doped indium oxide (ATO), indium tin oxide (ITO), zinc oxide, tin oxide, or fluorine-doped indium oxide (FTO). In the process of producing the photoelectric conversion element 103 according to the embodiment, it is necessary to perform a heat treatment. Therefore, as the material of the negative electrode layer 102, ATO having heat resistance is preferable among the above-described materials.

As described above, when the positive electrode layer (positive electrode member) 101 or the negative electrode layer (negative electrode member) 102 is formed on the light transmission side in order to allow the photoelectric conversion element 103 to receive light, a material having light-transmitting properties (that is, a transparent or semi-transparent electrode material) may be used. Examples of the electrode material of these electrode layers include a conductive metal oxide film and a semi-transparent metal thin film. Specifically, a film formed using a conductive material, for example, indium oxide, zinc oxide, tin oxide, or a complex thereof such as indium tin oxide (ITO), indium zinc oxide (IZO), or NESA, a film formed using gold, platinum, silver, copper, or the like is used. Among these electrode materials, ITO, indium zinc oxide, or tin oxide is preferable. Examples of a method of forming the electrode include a vacuum deposition method, a sputtering method, an ion plating method, and a plating method. In addition, as the electrode material, an organic transparent conductive film such as polyaniline or a derivative thereof or polythiophene or a derivative thereof may be used.

Another electrode in which light transmission is not necessary is not necessarily transparent, and as an electrode material of the electrode, a metal, a conductive polymer, or the like can be used. Specific examples of the electrode material include a metal such as aluminum (Al), zinc (Zn), or the like, an alloy of two or more among the metals, an alloy of one or more among the above-described metals and one or more metals selected from the group consisting of gold (Au), silver (Ag), platinum (Pt), copper (Cu), manganese (Mn), titanium (Ti), cobalt (Co), nickel (Ni), tungsten (W), and tin (Sn), graphite, a graphite intercalation compound, polyaniline or a derivative thereof, and polythiophene or a derivative thereof. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy.

As shown in FIG. 1, mainly, the photoelectric conversion element 103 may include a first layer 104, a second layer 105, and a third layer 106 that are laminated, in which the first layer 104 is formed of a plurality of particles 104a including an inorganic semiconductor as a main component, the second layer 105 is provided on a surface of each of the particles 104a and is formed of a thin film including a perovskite structure as a main component, and the third layer 106 is formed of a thin film including an organic metal complex as a main component. That is, the photoelectric conversion device 100 and the photoelectric conversion element 103 may be configured such that at least a current path from the positive electrode layer 101 to the negative electrode layer 102 is formed in order of the positive electrode layer 101, the third layer 106, the second layer 105, the first layer 104, and the negative electrode layer 102. It is preferable that the number of current paths to be formed be as large as possible, and current paths adjacent to each other may or may not be electrically connected to each other. In the embodiment, "layer" refers to a film that is formed by performing a film formation process once or multiple times, and the film is not limited to being flat and is not necessarily an integrated film.

Further, materials and compositions of the three layers 104 to 106 are determined such that energy levels in the conduction band (LUMO, excited state) are higher in order of the first layer 104, the second layer 105, and the third layer 106 and an energy level of the second layer in a valence band (HOMO, the ground state) is higher than an energy level of the third layer 106 in the valence band. In the conduction band, the energy level of the second layer 105 is higher than the energy level of the first layer 104 and the energy level of the third layer 106 is higher than an energy level of the second layer 105. For example, in the first layer 104, the energy level in the valence band can be set to be −8 eV or higher, and the energy level in the conduction band can be set to be −4 eV or lower. At this time, in the second layer 105, the energy level in the valence band can be set to be −5.5 eV or higher, and the energy level in the conduction band can be set to be −3 eV or lower. In addition, in the third layer 106 (preferably for example, an inorganic transition metal ion 106A), it is preferable that the energy level in the valence band be −6 eV or higher and the energy level in the conduction band be −2 eV or lower.

The first layer 104 is an aggregate of the plurality of particles 104a formed on the negative electrode layer 102, and is a porous film including a plurality of gaps between the particles 104a. The particle 104a adjacent to the second layer 105 is in direct contact with the negative electrode layer 102 or in indirect contact with the negative electrode layer 102 through another particle 104a so as to be electrically connected to the negative electrode layer 102.

It is preferable that the inorganic semiconductor in the particles 104a be an inorganic semiconductor having an absorption wavelength in an ultraviolet range, and examples thereof include titanium oxide and zinc oxide. The thickness of the first layer 104 is preferably about 10 nm or more and 1000 nm or less and more preferably about 50 nm or more and 500 nm or less.

In the production step, the second layer 105 is a thin film that covers an exposed portion on the surfaces of the particles 104a of the inorganic semiconductor, that is, a portion that is not in contact with the negative electrode layer 102 and the particles 104a of the inorganic semiconductor. The second layer 105 does not need to cover the entirety of the exposed portion but has to cover at least the positive electrode layer 101 side in order to form the above-described current path.

The perovskite structure forming the second layer 105 is formed of a plurality of molecules including a metal cation such as $Pb^{2+}$ or $Sn^{2+}$, a halide anion such as $I^-$, $Cl^-$, or $Br^-$, and an organic cation such as $CH_3NH_3^+$ (MA), $NH=CHNH_2^+$(FA), or $Cs^+$. Depending on the number of ions selected from the metal cation, the halide anion, and the organic cation, the size and form of a band gap can be changed. When tin is added to the perovskite structure, the band gap is narrowed, and responsiveness to light having a long wavelength such as near infrared light can be improved. Regarding each of the molecules forming the perovskite structure, the halide anion is disposed at a vertex of a regular octahedron around a metal ion, and the organic cation is disposed at a vertex of a cube around a metal ion and including a regular octahedron.

In addition, it is preferable that the energy level of the second layer 105 in the valence band also be higher than the energy level of the third layer 106 in the valence band and is intermittently connected to the same energy level. Examples of the composition of the second layer 105 (perovskite structure) satisfying these conditions include $CH_3NH_3PbI_3$, $NH=CHNH_2PbI_3$, and $CsI_3$. In addition, for example, a halide anion such as $CH_3NH_3PbI_3$ in which a composition ratio between I and Cl is changed can be used.

The third layer 106 may be a thin film that covers a surface (exposed surface) of a molecule of the perovskite structure in the second layer of a photoelectric conversion element precursor including the first layer 104 and the second layer 105. A molecule of the organic metal complex forming the third layer 106 is obtained by forming a coordinate bond between the inorganic transition metal ion 106A and an organic ligand 106B.

The inorganic transition metal ion 106A may be localized on the second layer side in a film shape so as to be directly bonded to the perovskite structure of the second layer 104. On the other hand, the organic ligand 106B may be localized on a side (positive electrode side) opposite to the second layer in a film shape. In order to realize amplification of a photocurrent described below, the molecule of the organic metal complex may be bonded to the molecule of the perovskite structure such that the organic ligand 106B and the inorganic transition metal ion 106A are arranged in this order on the current path from the positive electrode layer 101 side to the second layer 105 side. That is, this structure is divided into a layer formed of the inorganic transition metal ion and a layer formed of the organic ligand ion. A boundary between the two layers can also be observed using, for example, a transmission electron microscope (TEM).

Examples of the inorganic transition metal ion described herein include $Eu^{3+}$, $Cr^{3+}$, and the like where the reduction potential is LUMO and $Ru^{2+}$, $Fe^{2+}$, $Mn^{2+}$, $Co^{2+}$, and the like where the oxidation potential is HOMO. In addition, examples of the organic ligand described herein include a ligand of a general metal complex, for example, (i) an organic compound having a carboxyl group, a nitro group, a sulfo group, a phosphate group, a hydroxy group, an oxo group, or an amino group; (ii) an ethylenediamine derivative; (iii) a ring heteroatom-containing organic ligand such as a terpyridine derivative, a phenanthroline derivative, or a bipyridine derivative; and (iv) an acetylacetonate-based organic ligand (here, "acetylacetonate-based organic ligand" refers to an organic ligand capable of forming a coordinate bond with many transition metal ions through two oxygen atoms (for example, while forming a six-membered ring)) such as a catechol derivative, a quinone derivative, a naphthoic acid derivative, or an acetylacetonate derivative (specifically, for example, acetylacetone). The terpyridine derivative has a composition represented by the following Formula (1).

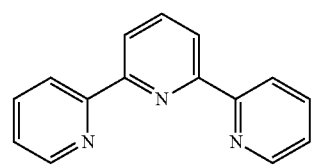 [SMILES: c1ccc(-c2cccc(-c3ccccn3)n2)nc1]

When the photoelectric conversion device 100 according to the embodiment is applied to a light sensor, the photoelectric conversion device 100 is mounted on a semiconductor substrate such as silicon or a glass substrate. In this case, for example, the following device configurations can be adopted.

(1) a form where the negative electrode layer 102 having transparency is formed on the uppermost layer which is most distant from the semiconductor substrate (that is, a configuration where the (transparent) negative electrode layer 102/the first layer 104/the second layer 105/the third layer 106/the positive electrode layer 101/the (Si) substrate are laminated in this order from the uppermost layer on the light incidence side)

(2) a form where the positive electrode layer 101 having transparency is formed on the uppermost layer most distant from the semiconductor substrate (that is, a configuration where the (transparent) positive electrode layer 101/the third layer 106/the second layer 105/the first layer 104/the negative electrode layer 102/the (Si) substrate are laminated in this order from the uppermost layer on the light incidence side)

(3) a form where the negative electrode layer 102 having transparency is formed adjacent to the glass substrate (that is, a configuration where the (glass) substrate/the negative electrode layer 102/the first layer 104/the second layer 105/the third layer 106/the positive electrode layer 101 are laminated in this order from the uppermost layer on the light incidence side)

(Production Method for Photoelectric Conversion Device)

(a) to (e) of FIG. 2 are cross-sectional views showing an object to be processed in the process of producing the photoelectric conversion device 100. (a) and (b) of FIG. 3 show enlarged views showing a part R of a cross-section of the object to be processed in (c) of FIG. 2.

The photoelectric conversion device 100 can be produced mainly according to the following procedure.

First, as shown in (a) of FIG. 2, a member forming the negative electrode layer 102 including a substrate 102A is prepared in order to form the photoelectric conversion element 103. As the member forming the negative electrode layer 102 including the substrate 102A, an electrode member that functions as a negative electrode layer and has transparent conductivity may be used. Here, the case where the buffer layer 107 is formed on one surface of the member forming the negative electrode layer 102 including the substrate 102A is described as an example. However, this buffer layer 107 is not necessarily formed. The buffer layer 107 is formed by applying a solution of a material to the member forming the negative electrode layer 102 including the substrate 102A using a spin coating method or the like and heating (drying) the applied solution. This heating may be performed, for example, at about 120° C. to 450° C. for 10 minutes to 60 minutes. Conditions (for example, the application time) of the material application may be adjusted such that the thickness of the buffer layer 107 is, for example, about 1 nm to 100 nm.

Next, as shown in (b) of FIG. 2, the first layer 104 that is formed of a plurality of particles 104A including an inorganic semiconductor as a main component is formed on one surface side of the member forming the negative electrode layer 102 including the substrate 102A (when the buffer layer 107 is present, with the buffer layer 107 interposed therebetween). As in the buffer layer 107, the first layer 104 can also be formed by applying a solution of a material and heating the applied solution. This heating may be performed, for example, at about 120° C. to 450° C. for 10 minutes to 60 minutes. Conditions (for example, the application time) of the material application may be adjusted such that the thickness of the first layer 104 is, for example, about 10 nm to 1000 nm and preferably about 50 nm to 500 nm.

Next, as shown in (c) of FIG. 2, the second layer 105 may be formed by applying a solution of a material including a perovskite structure as a main component to surfaces of the particles 104A using a spin coating method, a dipping method, or the like and heating the applied solution. This heating may be performed, for example, at about 40° C. to 100° C. for 5 minutes to 10 minutes. Conditions (for example, the application time) of the material application may be adjusted such that the thickness of the second layer 105 is, for example, about 1 nm to 10 nm. By using a liquid material, the second layer 105 having a small thickness can be formed as compared to a case where a solid inorganic semiconductor such as silicon is used.

Next, as shown (d) of FIG. 2, the third layer 106 may be formed on the second layer 105. More specifically, the third layer 106 may be formed by applying a solution of a material including an organic metal complex as a main component to the second layer 105 using a spin coating method, a dipping method, or the like and heating the applied solution. Actually, substantially all the gaps between the particles 104a of the first layer are buried during the formation of the second layer 105. Therefore, the third layer 106 can be formed in a film shape on an exposed portion of the surface of the second layer 105 mainly on the positive electrode layer 101 side (the side opposite to the member forming the negative electrode layer 102 including the substrate 102A).

Here, the application and heating of the solution may be performed in two steps. That is, in the first step, the solution of the inorganic transition metal such as europium may be applied and heated. Next, in the second step, the solution of the organic ligand such as terpyridine may be applied and heated. This way, as a result of performing the formation of the third layer 106 in the two steps, the third layer 106 has a structure where the layer formed of the inorganic transition metal and the layer formed of the organic ligand are laminated in order from the second layer 105.

Finally, as shown in (e) of FIG. 2, an electrode member 101A that functions as a positive electrode and has conductivity is placed on the third layer 106, more specifically, on the layer formed of the organic ligand. As a result, the photoelectric conversion device 100 according to the embodiment can be obtained.

(a) to (c) of FIG. 3 are diagrams showing an operation principle (action) of the photoelectric conversion device 100 according to the embodiment. (a) to (c) of FIG. 3 show structures of energy bands of each of the layers before light irradiation, immediately after light irradiation, and after a predetermined time from light irradiation.

In a state where light is not irradiated, the energy level of the third layer 106 in the conduction band is higher than the Fermi level of the positive electrode layer 101 on the positive electrode layer 101 side, and a current from the positive electrode layer 101 to the negative electrode layer 102 is blocked as shown in (a) of FIG. 3.

When the photoelectric conversion element is irradiated with light, the perovskite structure forming the second layer 105 absorbs the light to generate electrons and holes such that the electrons are transferred to the conduction band and the holes are transferred to the valence band as shown in (b) of FIG. 3.

At this time, energy levels $E_{c1}$, $E_{c2}$, and $E_{c3}$ of the first layer, the second layer, and the third layer in the conduction bands have a relationship of $E_{c3} > E_{c2} > E_{c1}$. As shown in (c)

of FIG. 3, the electrons that are generated in the second layer and are transferred to the conduction band of same layer are transferred to the conduction band of the first layer having a lower energy state. On the other hand, the energy levels $E_{v1}$, $E_{v2}$, and $E_{v3}$ of the first layer, the second layer, and the third layer in the valence bands have relationships of $E_{v2}>E_{v1}$ and $E_{v2}>E_{v3}$. Therefore, the holes that are generated in the second layer and are transferred to the valence band are trapped in the valence band of the second layer having an energy state higher than (for the holes, lower than) those of the first layer and the third layer as shown in (c) of FIG. 3.

Due to the effect (positive potential) of the holes that are trapped and distributed in a concentrated manner, in the vicinity of the valence band of the second layer, the potential energy of the electrons decreases, and the energy level in the conduction band decreases. The energy level in the conduction band decreases significantly toward the second layer where the holes are trapped. Therefore, the energy level of the third layer in the conduction band decreases more significantly on the second layer side and has a sharp shape on the positive electrode layer side. Accordingly, for the electrons present in the positive electrode layer 101, the energy barrier of the third layer becomes thinner, and the electrons can be tunneled to the negative electrode layer side. That is when the photoelectric conversion element are irradiated with light, a large number of electrons (electrons that are not irradiated with light) on the positive electrode side that are blocked by the energy barrier of the third layer tunnel (transmit) through the thin energy barrier and flow to the negative electrode side. As a result, it is considered that the current that is directly generated by the irradiated light can be significantly amplified.

The thickness of the third layer 106 is preferably, for example, about 1 nm or more and 10 nm or less. When the thickness of the third layer 106 is more than 10 nm, the energy barrier becomes significantly thick, and sufficient tunneling probability cannot be obtained, which interferes with the amplification of a photocurrent in the photoelectric conversion element 103. In addition, in the case that the thickness of the third layer 105 is less than 1 nm, the tunneling current flows even when light is not irradiated and the band is not bent. As a result, the light detection function of the photoelectric conversion element 103 is lost.

As described above, when the photoelectric conversion device 100 according to the embodiment is irradiated with light in a driven state by applying a voltage between the positive electrode layer 101 and the negative electrode layer 102, a photocurrent can be generated, amplified, and output. Since the photoelectric conversion device 100 can be driven at a low voltage, a photocurrent can be output in a state where the generation of noise is suppressed, and the measurement accuracy of the photocurrent can be improved. For example, amplification with a higher gain can be performed even at a driving voltage of 1 V or lower. A high bias (that is, a high-voltage driving circuit) is unnecessary, and thus a small battery such as a dry cell can be used as a power supply. As a result, compactness of a product that cannot be achieved in the related art can be achieved. Further, the photoelectric conversion device 100 according to the embodiment can amplify absorbed light in the order of $10^5$ times as described below in Examples. Therefore, even weak light can be easily detected. Further, in the photoelectric conversion device 100 according to the embodiment, the shape of the energy level can be easily changed by adjusting a combination of the materials of the respective layers and the compositions thereof. Therefore, the response sensitivity can be improved, and light having a desired wavelength can also be selectively absorbed.

EXAMPLES

Hereinafter, the effects of the present invention will be further clarified using Examples. The present invention is not limited to the following Examples, and appropriate changes can be made within a range where the scope of the present invention Example 1

Using the above-described production method for the photoelectric conversion device, the photoelectric conversion device 100 according to Example 1 was produced specifically under the following conditions.

First, as the member forming the negative electrode layer including the substrate, a member including antimony-doped indium oxide (ATO) as a component was prepared. 200 µl of an ethanol ($C_2H_5OH$) solution including europium chloride hydrate ($EuCl_3.6H_2O$) at a concentration of 10 mM was applied to one surface of the member using a spin coating method at a rotation speed of 3000 rpm. Next, the mixed solution applied using the spin coating method was heated at 120° C. for 10 minutes and was heated at 450° C. for 1 hour in this order. As a result, a buffer layer including europium oxide ($Eu_2O_3$) as a main component was formed.

Next, 120 µl of a mixed solution including a titanium oxide (TiO2) paste (PST18NR, manufactured by JGC C&C) and ethanol at a weight ratio of 1:3.5 was applied to the buffer layer using a spin coating method at a rotation speed of 6000 rpm. Next, the mixed solution applied using the spin coating method was heated at 120° C. for 10 minutes and was heated at 450° C. for 1 hour in this order. As a result, a first layer (porous film) formed of a plurality of particles including titanium oxide as a main component was formed.

Next, 100 µl of a mixed solution dimethylformamide (DMF) and dimethyl sulfoxide (DMSO) was applied to each of the particles of the first layer using a spin coating method at a rotation speed of 5000 rpm, the mixed solution including lead iodide ($PbI_2$) and methylammonium at a concentration of 0.5 M or lower. Next, the mixed solution applied using the spin coating method was heated at 40° C. for 5 minutes, was heated at 70° C. for 5 minutes, and was heated at 100° C. for 10 minutes in this order. As a result, a second layer including a perovskite structure ($CH_3NH_3PbI_3$) as a main component was formed.

Next, 100 µl of an isopropyl alcohol (IPA) solution including europium chloride ($EuCl_3$) at a concentration of 5 mM was applied to the second layer using a spin coating method at a rotation speed of 5000 rpm. Next, the mixed solution applied using the spin coating method was heated at 100° C. for 15 minutes. As a result, a layer including europium as a main component was formed.

Next, 200 µl of an isopropyl alcohol (IPA) solution including terpyridine (2,2':6',2"-terpyridine) at a concentration of 20 mM was left on the layer including europium as a main component for 30 seconds and was applied to the layer including europium as a main component using a spin coating method at a rotation speed of 3000 rpm. Next, the mixed solution applied using the spin coating method was heated at 100° C. for 15 minutes. As a result, a layer including terpyridine as a main component was formed.

Finally, a positive electrode layer (Ag) was formed (deposited) to be in contact with the third layer and on a side opposite to the negative electrode layer across the laminate including the first layer, the second layer, and the third layer. As a result, the photoelectric conversion device according to the present invention was able to be formed.

Comparative Example 1

The layers including up to the second layer were formed using the production method for the photoelectric conversion device, and the positive electrode layer was formed to be in contact with the second layer and on a side opposite to the negative electrode layer across the laminate including the first layer and the second layer. As a result, a photoelectric conversion device according to Comparative Example 1 was formed. The photoelectric conversion device according to Comparative Example 1 was the same as the photoelectric conversion device according to Example 1, except that the third layer was not provided. The photoelectric conversion device for comparison was manufactured under the same conditions as those of Example 1.

Comparative Example 2

The layers including up to the second layer were formed using the above-described production method for the photoelectric conversion device, and only the inorganic transition metal ion 106A in the third layer was laminated. The positive electrode layer was formed to be in contact with a third layer 106A and on a side opposite to the negative electrode layer across the laminate including the first layer, the second layer, and the third layer 106A. As a result, a photoelectric conversion device according to Comparative Example 2 was formed. The photoelectric conversion device according to Comparative Example 1 was the same as the photoelectric conversion device according to Example 1, except that the third layer 106B was not provided. The photoelectric conversion device for comparison was manufactured under the same conditions as those of Example 1.

Comparative Example 3

The layers including up to the second layer were formed using the above-described production method for the photoelectric conversion device, and only the organic ligand 106B in the third layer was laminated. The positive electrode layer was formed to be in contact with the third layer 106B and on a side opposite to the negative electrode layer across the laminate including the first layer, the second layer, and the third layer 106B. As a result, a photoelectric conversion device according to Comparative Example 2 was formed. The photoelectric conversion device according to Comparative Example 1 was the same as the photoelectric conversion device according to Example 1, except that the third layer 106A was not provided. The photoelectric conversion device for comparison was manufactured under the same conditions as those of Example 1.

Example 2

The layers including up to the first layer were formed using the production method for the photoelectric conversion device, and the concentration of the mixed solution during the formation of the second layer was set to 0.5 M or higher. Conditions (for example, the application time) of the material application were adjusted such that the thickness of the second layer 105 was 10 nm or more. The third layer was formed using the same method as that of Example 1, and the positive electrode layer was formed to be in contact with the third layer and on a side opposite to the negative electrode layer across the laminate including the first layer, the second layer, and the third layer. As a result, a photoelectric conversion device according to Example 2 was formed. The photoelectric conversion device according to Comparative Example 1 was the same as the photoelectric conversion device according to Example 1, except for the concentration during the formation of the second layer. The photoelectric conversion device according to the present invention was manufactured under the same conditions as those of Example 1.

Example 3

The photoelectric conversion device according to the present invention was manufactured under the same conditions as those of Example 1, except that acetylacetone (2,4-pentanedione) was used instead of terpyridine (2,2':6', 2"-terpyridine) used during the formation of the third layer in the production method for the photoelectric conversion device according to Example 1.

Example 4

The layers including up to the second layer were formed under the same conditions as those of Example 1. During the formation of the third layer, 100 μl of an isopropyl alcohol solution including iron chloride ($FeCl_3$) at a concentration of 5 mM was applied using a spin coating method instead of europium chloride. Next, the applied solution was heated at 100° C. for 15 minutes to form a layer including iron as a main component. Using the same method as that of Example 1, 100 μl of an isopropyl alcohol solution including terpyridine at a concentration of 20 mM was applied to this layer using a spin coating method and was heated at 100° C. for 15 minutes. As a result, a layer including terpyridine as a main component was formed. An iron oxide layer where a band structure was likely to be deformed was formed on the second layer side of the third layer. Therefore, here, process conditions were adjusted such that the energy level of the conductor of the iron oxide layer was higher than the energy level of the conductor of the second layer. The positive electrode layer was formed under the same conditions as those of Example 1.

Example 5

The layers including up to the second layer were formed under the same conditions as those of Example 1. During the formation of the third layer, 100 μl of an isopropyl alcohol solution including cobalt chloride (CoCl2) at a concentration of 5 mM was applied using a spin coating method instead of europium chloride. Next, the applied solution was heated at 100° C. for 15 minutes to form a layer including cobalt as a main component. Using the same method as that of Example 1, 100 μl of an isopropyl alcohol solution including terpyridine at a concentration of 20 mM was applied to this layer using a spin coating method and was heated at 100° C. for 15 minutes. As a result, a layer including terpyridine as a main component was formed. The positive electrode layer was formed under the same conditions as those of Example 1.

[Measurement 1]

Figure 4:
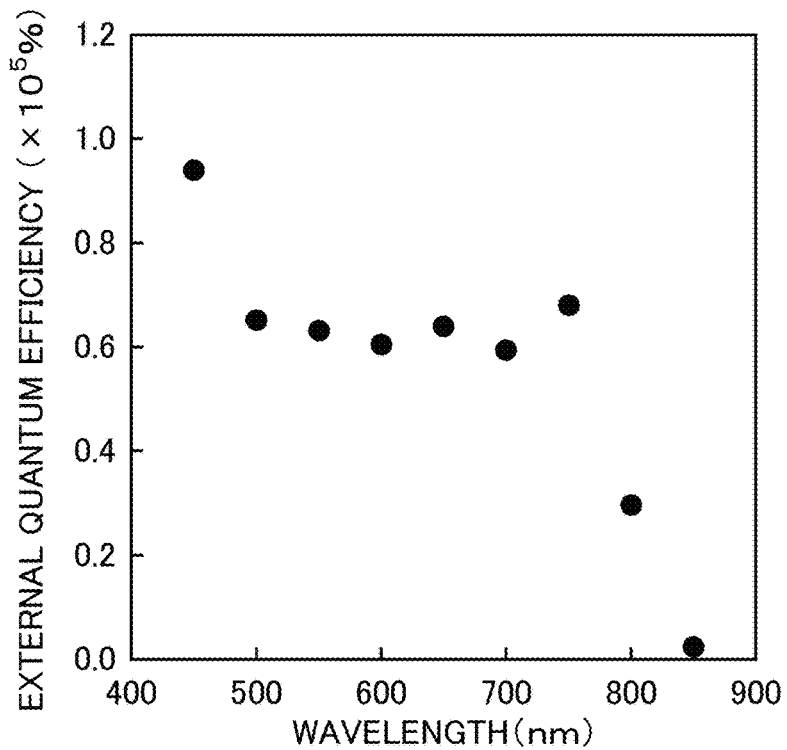
FIG. 4 is a graph showing a relationship between a wavelength of light to be irradiated and an external quantum efficiency in a photoelectric conversion element according to Examples of the present invention.

The photoelectric conversion element according to Example 1 was irradiated with light having various wavelengths, and the external quantum efficiency (EQE) was measured in each of the cases. The voltage applied between the positive electrode layer and the negative electrode layer was −0.5 V. FIG. 4 is a graph showing the measurement result. In this graph, the horizontal axis represents a wavelength (nm) of irradiated light, and the vertical axis represents the external quantum efficiency (%). The external quantum efficiency refers to a ratio ($N_e/N_c$) between the number $N_c$ of incident photons on the photoelectric conversion element per unit time and unit area and the number $N_e$ of electrons converted and generated from the incident photons.

It can be seen from this graph that, when visible light having a wavelength of about 400 nm to 750 nm is irradiated, a high external quantum efficiency of $5\times10^4$% or higher can be obtained. That is, it can be seen that visible light having a lower energy than ultraviolet light that is detected by a photoelectric conversion element in the related art can be sufficiently detected by using the photoelectric conversion element (photoelectric conversion device) according to the present invention.

[Measurement 2]

Figure 5:
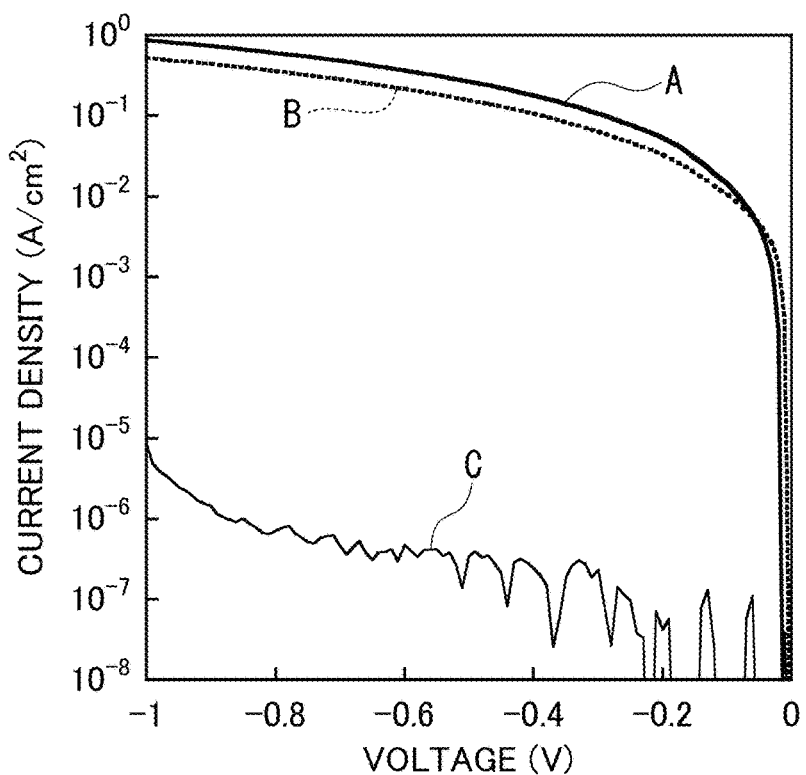
FIG. 5 is a graph showing a wavelength dependence of a relationship between a driving voltage and a photocurrent in the photoelectric conversion element according to Examples of the present invention.

By irradiating the photoelectric conversion element according to Example 1 with light having various wavelengths, various voltages were applied to the photoelectric conversion element according to Example 1, various light irradiation conditions were set, and a photocurrent generated in each of the cases was measured. FIG. 5 is a graph showing the measurement result. In this graph, the horizontal axis represents an applied voltage (V), and the vertical axis represents a photocurrent density (A/cm²). As light irradiation conditions, the next four conditions A to C were set.

Condition A: sunlight of about 1.0 mW/cm² was irradiated.

Condition B: visible light of about 0.7 mW/cm² was irradiated.

Condition C: light irradiation was not performed.

It can be seen from this graph that, even when visible light was irradiated (conditions A and B) by applying a low voltage, a high photocurrent (density) of $10^{-3}$ A/cm² or higher was generated. That is, the photoelectric conversion element (photoelectric conversion device) according to the present invention can be driven at a low voltage, and visible light can be sufficiently detected. By driving the photoelectric conversion element at a low voltage, the generation of noise can be suppressed. On the other hand, it can be seen that a photocurrent generated when light irradiation was not performed (condition C) was $10^{-5}$ A/cm² or lower, and a current generated when light was not irradiated, that is, a leakage current was sufficiently suppressed.

[Measurement 3]

Figure 6:
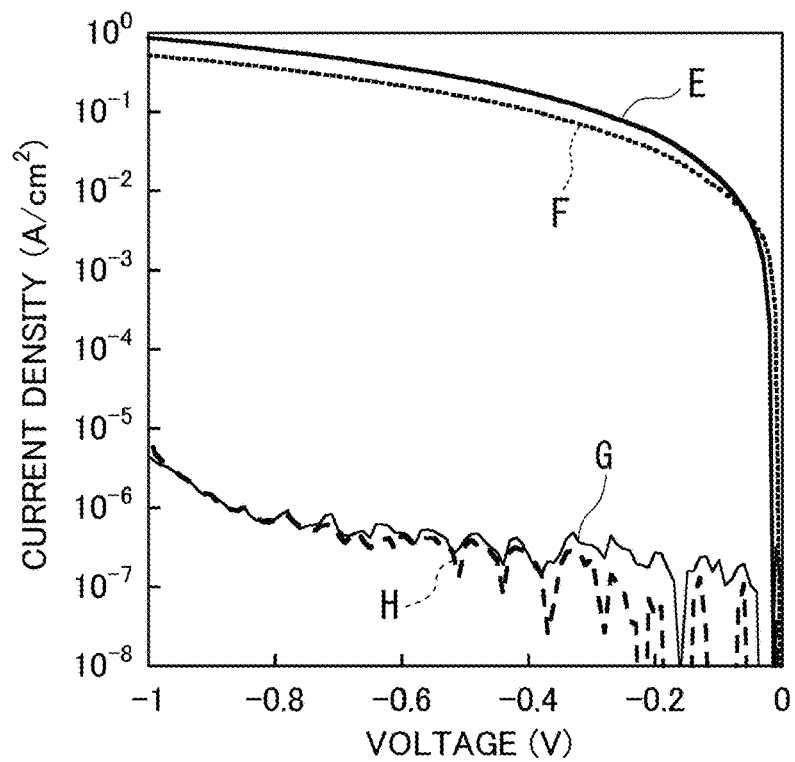
FIG. 6 is a graph showing a time dependence of a relationship between a driving voltage and a photocurrent in the photoelectric conversion element according to Examples of the present invention.

Various voltages were applied to the photoelectric conversion element according to Example 1, various light irradiation conditions were set, and a photocurrent was measured using the same method as that of [Measurement 2] in each of the cases. FIG. 6 is a graph showing the measurement result. The horizontal axis and the vertical axis in this graph are the same as those in the graph of FIG. 5. As light irradiation conditions, the next four conditions E to H were set.

Condition E: sunlight of about 1.0 mW/cm² was irradiated immediately after the production.

Condition F: sunlight of about 1.0 mW/cm² was irradiated after about one week from the production.

Condition G: light irradiation was not performed immediately after the production.

Condition H: light irradiation was not performed after about one week from the production.

It can be seen from this graph that, even when visible light was irradiated (conditions E and F) by applying a low voltage, the result that a high photocurrent (density) of $10^{-3}$ A/cm² or higher was generated did not substantially change even over time. In addition, it can be seen that a photocurrent generated when light irradiation was not performed (condition D) was $10^{-5}$ A/cm² or lower, and the result that the leakage current was sufficiently suppressed did not substantially change even over time. Accordingly, it can be seen that the photoelectric conversion element (photoelectric conversion device) according to the present invention has high reliability even over time.

[Measurement 4]

Figure 7:
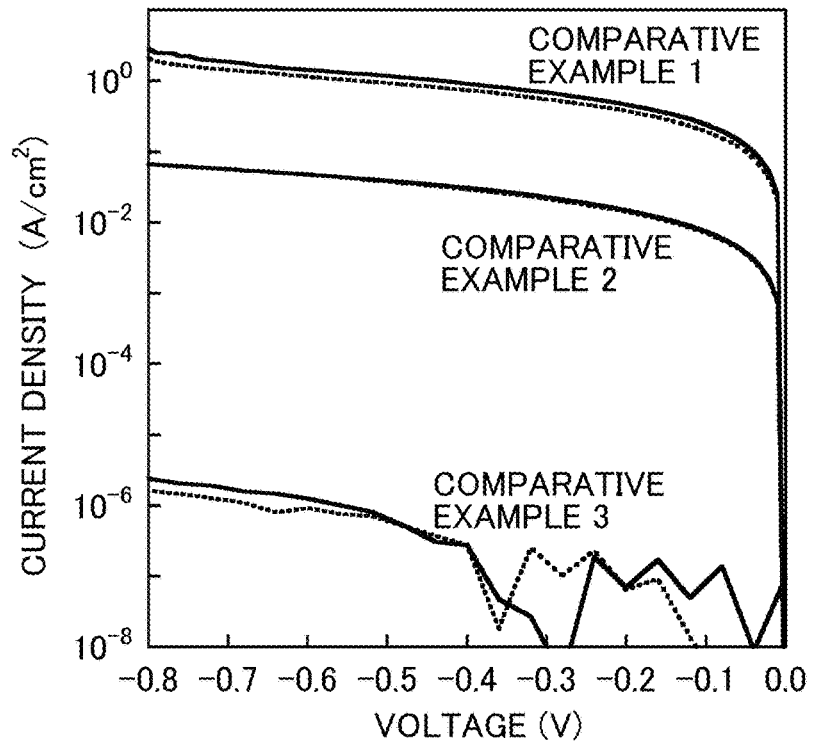
FIG. 7 is a graph showing a response sensitivity of a photocurrent obtained in each of photoelectric conversion elements according to Example 1 and Comparative Example 1 of the present invention.

By irradiating the photoelectric conversion elements prepared in Comparative Examples 1, 2, and 3 with visible light of about 0.7 mW/cm², various voltages were applied to the photoelectric conversion elements prepared in Comparative Examples 1, 2, and 3, and a photocurrent generated in each of the cases was measured. FIG. 7 is a graph showing the measurement result. In this graph, the horizontal axis represents an applied voltage (V), and the vertical axis represents a photocurrent density (A/cm²). A solid line represents a current during light irradiation, and a broken line represents a current in a dark place.

From this graph, when the third layer was not present the dark current increased, and there was no response to light irradiation. The same also applied to a case where the organic ligand 106B in the third layer was not present. When the metal layer 106A in the third layer was not present, the leakage current was suppressed, and there was no response to light irradiation. Accordingly, it can be seen that, in the photoelectric conversion element according to the present invention, the laminate structure including the first layer, the second layer, and the third layer is important.

[Measurement 5]

Figure 8:
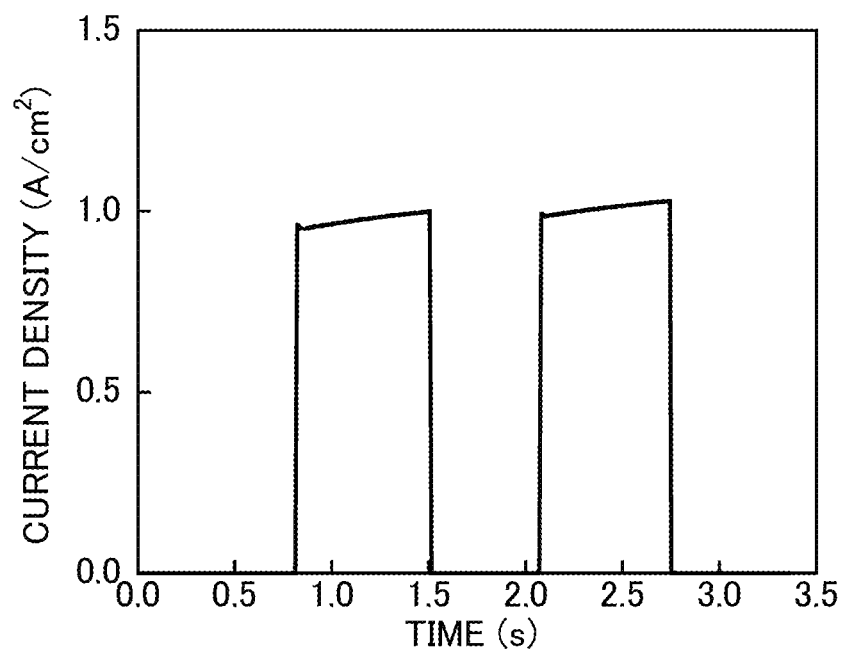
FIG. 8 is a graph showing a response speed of a photocurrent obtained in the photoelectric conversion element according to Example 1 of the present invention.
Figure 9:
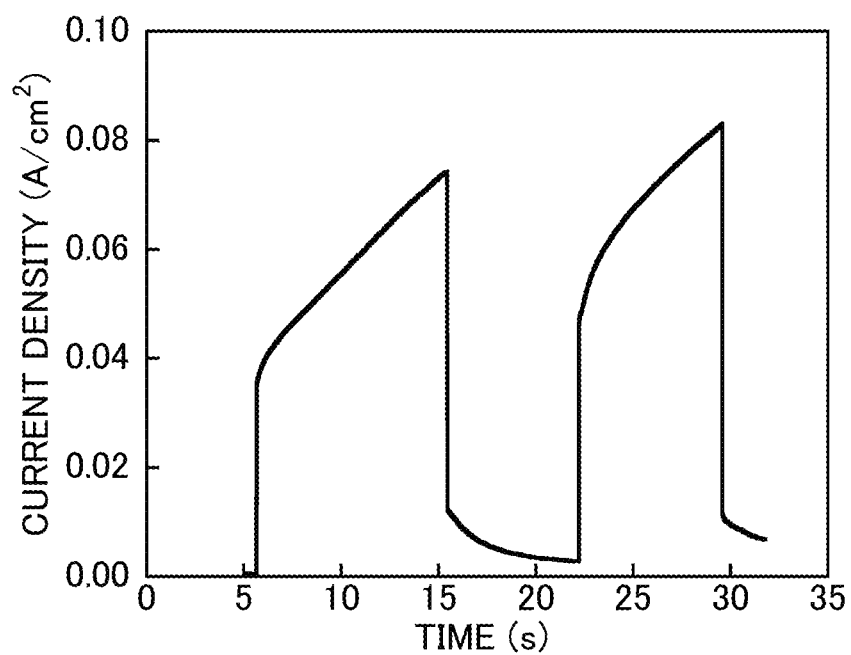
FIG. 9 is a graph showing a response speed of a photocurrent obtained in a photoelectric conversion element according to Example 2 of the present invention.
Figure 10:
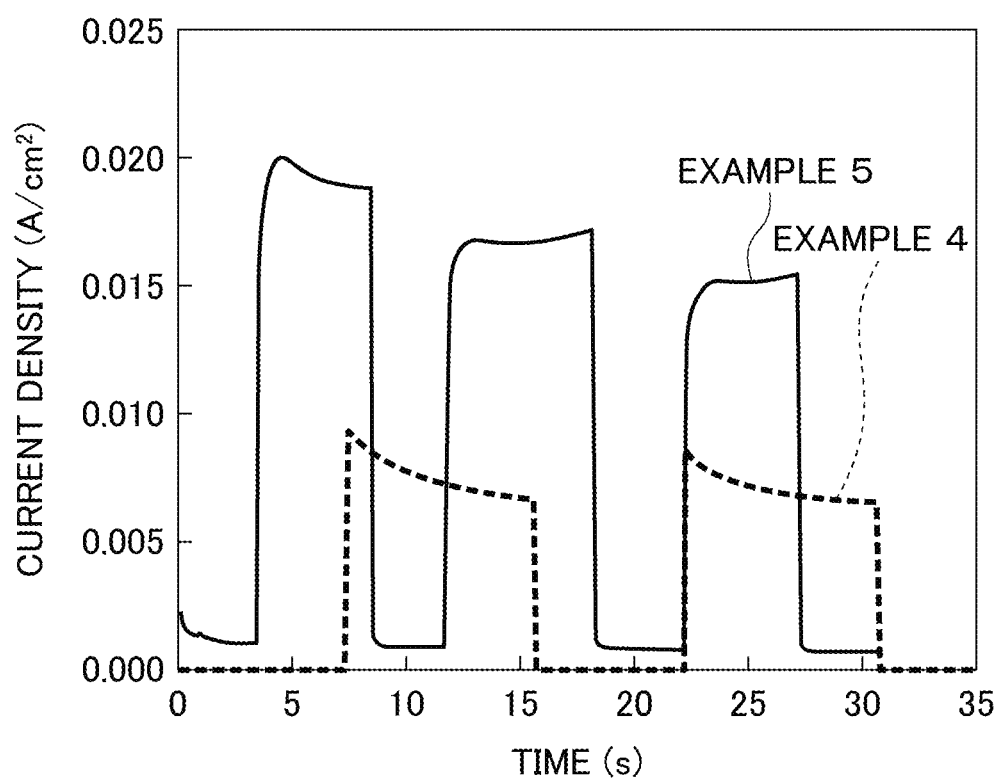
FIG. 10 is a graph showing a response speed of a photocurrent obtained in each of photoelectric conversion elements according to Example 4 and 5 of the present invention.

Light irradiation conditions were set at a predetermined timing for the photoelectric conversion elements according to Examples 1, 2, 4, and 5, and a photocurrent generated in each of the photoelectric conversion elements was measured using the same method as that of [Measurement 2]. The voltage applied between the positive electrode layer and the negative electrode layer was −0.5 V. The wavelength and irradiance of light irradiated by the photoelectric conversion element were 550 nm and 0.76 mW/cm², respectively. FIGS. 8 and 9 are graphs showing the measurement results corresponding to the photoelectric conversion elements according to Examples 1 and 2, respectively. FIG. 10 is a graph showing the measurement results corresponding to the photoelectric conversion elements according to Examples 4 and 5, respectively. In these graphs, the horizontal axis represents an elapsed time (s), and the vertical axis represents a photocurrent (A/cm²).

In the graph of FIG. 8, the photocurrent in the photoelectric conversion element according to Example 1 rose instantaneously up to about a maximum value (maximum value: about 1.0 A/cm²). On the other hand, in the graph of FIG. 9, the photocurrent in the photoelectric conversion element according to Example 2 rose instantaneously from 0 A/cm² to about 0.04 A/cm². The current value slowly increased from this value and was not saturated even after 10 seconds. That is, it can be seen that, in the photoelectric conversion element according to Example 2, 10 seconds or longer was required until the photocurrent reached the maximum value after light was absorbed such that the photocurrent rose. Incidentally, the current value was lower than that of Example 1.

In the graph of FIG. 10, in the photoelectric conversion elements according to Examples 4 and 5, an instantaneous rise corresponding to light irradiation is shown. The amplification factor of the photocurrent was 20 times in Example 4 and was 42 times in Example 5.

It can be seen from the above comparison result that the photoelectric conversion element (photoelectric conversion device) according to the present invention where the thickness of the second layer was less than 10 nm had higher response speed (that is, improved response speed) to irradiated light than that of the photoelectric conversion element (photoelectric conversion device) according to the present invention where the thickness of the second layer was 10 nm or more. In addition, it can be seen from the above-described comparison result that, even when another material (here, Fe or Co) was used instead of europium ions as the organic metal complex for forming the third layer, the photoelectric conversion element according to the present invention can be used in practice.

Next, a cross-section of the photoelectric conversion element according to Example 1 was observed. The result is shown in FIGS. 11(a), 11(b), 12(a) and 12(b).

Figure 11A:
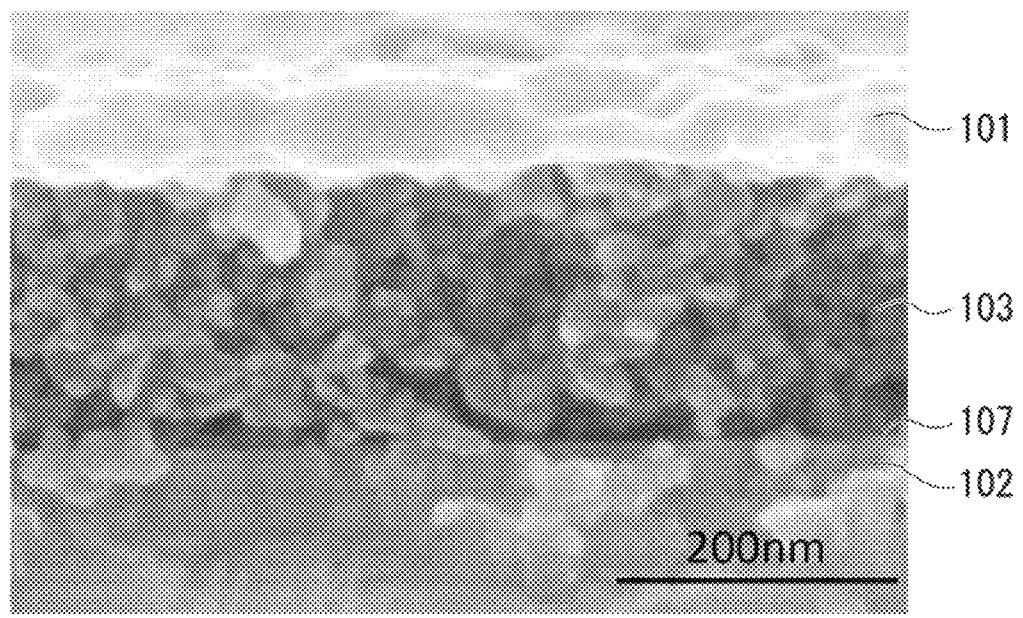
Figure 11B:
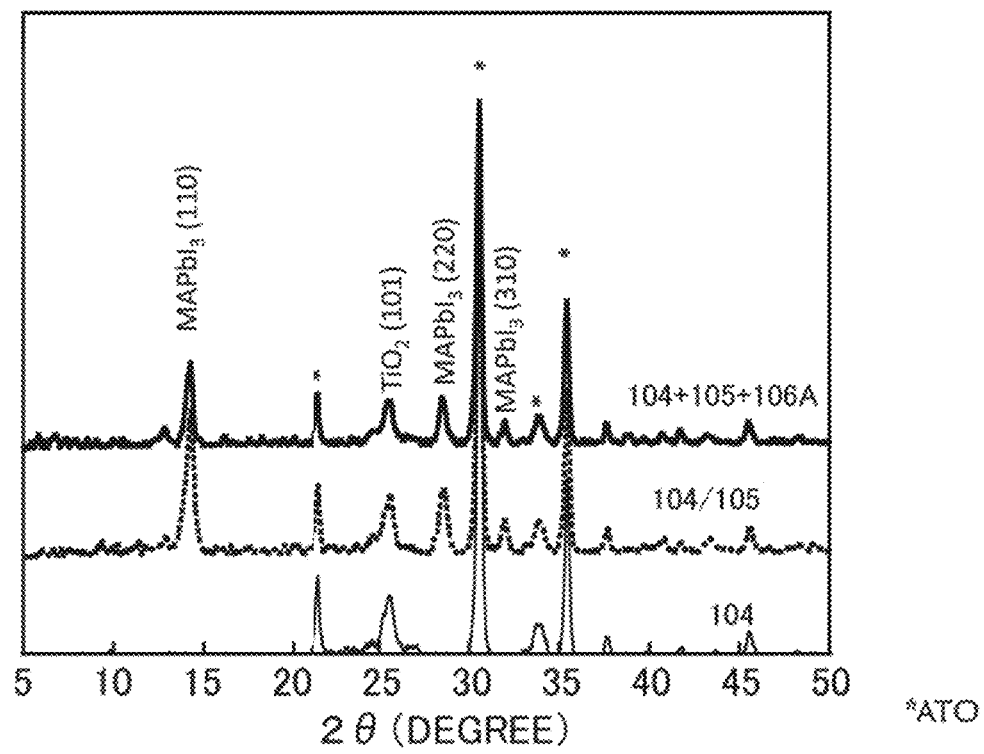

FIG. 11(a) shows the observation result by a cross-sectional SEM (scanning electron microscope), and FIG. 11(b) shows the observation result by XRD (crystal structure analysis by an X-ray diffractometer). It was found from FIG. 11(a) that the thickness of the laminate including the first layer, the second layer, and the third layer was about 180 nm. In addition, diffraction peaks derived from titanium oxide and perovskite were observed from FIG. 11(b). It can be seen from this that there was no structural change by laminating.

Figure 12A:
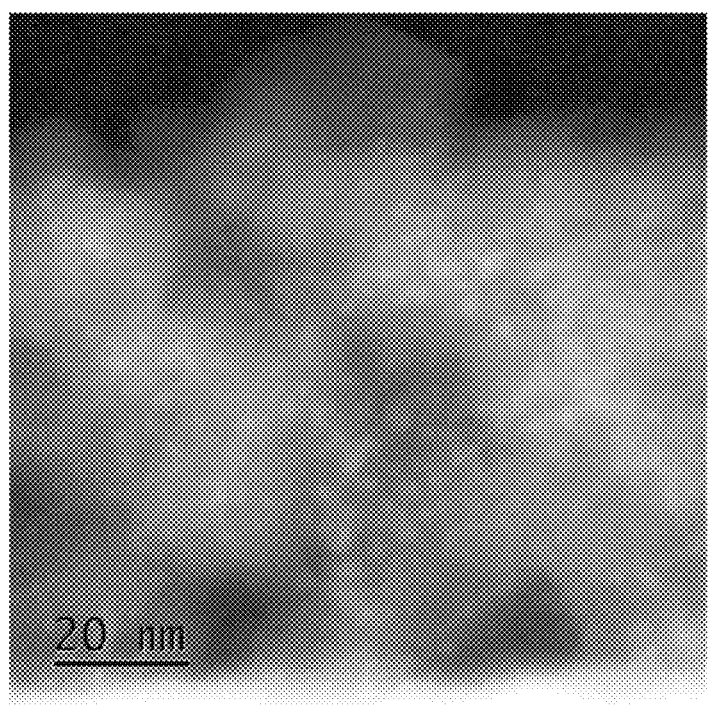
Figure 12B:
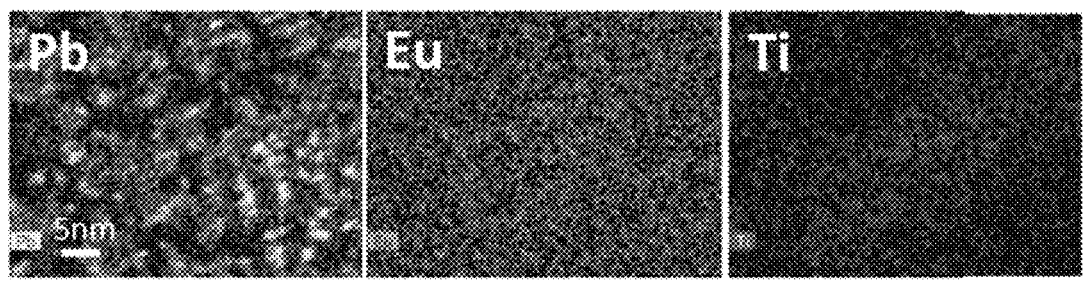

FIG. 12(a) shows the observation result by a cross-sectional TEM (transmission electron microscope), and FIG. 12(b) shows the observation result by EDS mapping (elemental analysis by an energy dispersive X-ray spectrometer). It can be seen from FIG. 12(a) that, in a cross-section of the laminate including the first layer, the second layer, and the third layer, fine particles having a particle size of about 2 nm to 3 nm were present in the surface of titanium oxide of the first layer. In addition, it was observed from FIG. 12(b) that the fine particles included lead (Pb) element and europium (Eu) element, and the second layer and the third layer were obtained by allowing the fine particles to be present in the respective layers above the first layer.

REFERENCE SIGNS LIST

100: photoelectric conversion device
101: positive electrode layer
102: negative electrode layer
103: photoelectric conversion element
104: first layer
105: second layer
106: third layer
106A: inorganic transition metal
106B: organic ligand
107: buffer layer

What is claimed is:

1. A photoelectric conversion element comprising a first layer, a second layer, and a third layer that are laminated in this order,
    wherein the first layer is formed of a plurality of particles including an inorganic semiconductor as a main component, an aggregate of the particles, or a thin film including an inorganic semiconductor as a main component,
    the second layer is provided on a surface of each of the particles or the aggregate and is formed of a plurality of particles including a perovskite structure as a main component, an aggregate of the particles, or a thin film including a perovskite structure as a main component,
    the third layer is formed of a plurality of particles including an organic metal complex as a main component, an aggregate of the particles, or a thin film including an organic metal complex as a main component,
    in a conduction band, an energy level of the second layer is higher than an energy level of the first layer and an energy level of the third layer is higher than the energy level of the second layer,
    in a valence band, an energy level of the second layer is higher than an energy level of the third layer,
    wherein the organic metal complex is a complex obtained by forming a coordinate bond between an inorganic transition metal and an organic ligand, and
    wherein the inorganic transition metal is localized on the second layer side.

2. The photoelectric conversion element according to claim 1,
    wherein the second layer is a layer in which an energy difference between the valence band and the conduction band is lower than 3.1 eV.

3. The photoelectric conversion element according to claim 1,
    wherein the first layer and/or the third layer is a layer in which an energy difference between the valence band and the conduction band is 3.1 eV or higher.

4. The photoelectric conversion element according to claim 1,
    wherein in the valence band, an energy level difference between the second layer and the third layer is 0.1 eV or higher.

5. The photoelectric conversion element according to claim 1,
    wherein the organic ligand is a ring heteroatom-containing organic ligand or an acetylacetonate-based organic ligand.

6. The photoelectric conversion element according to claim 1,
    wherein the organic metal complex is a complex obtained by forming a coordinate bond between an inorganic transition metal and a nonbonding electron pair of ring heteroatoms in a ring heteroatom-containing organic ligand.

7. The photoelectric conversion element according to claim 5,
    wherein the inorganic transition metal is europium, and the ring heteroatom-containing organic ligand is terpyridine.

8. The photoelectric conversion element according to claim 1,
    wherein the inorganic semiconductor is an inorganic semiconductor having an absorption wavelength in an ultraviolet range.

9. The photoelectric conversion element according to claim 1,
    wherein the inorganic semiconductor is titanium oxide.

10. The photoelectric conversion element according to claim 1,
    wherein the second layer is a thin film, particles, or an aggregate of the particles having a thickness of 1 nm or more and 10 nm or less.

11. The photoelectric conversion element according to claim 1,
wherein the perovskite structure is a compound represented by a compositional formula $CH_3NH_3PbI_3$.

12. The photoelectric conversion element according to claim 1,
wherein the first layer is a layer having an energy level of −8 eV or higher in the valence band and having an energy level of −4 eV or lower in the conduction band.

13. The photoelectric conversion element according to claim 1,
wherein the second layer is a layer having an energy level of −5.5 eV or higher in the valence band and having an energy level of −3 eV or lower in the conduction band.

14. The photoelectric conversion element according to claim 1,
wherein the third layer is a layer having an energy level of −6 eV or higher in the valence band and having an energy level of −2 eV or lower in the conduction band.

15. A photoelectric conversion device comprising the photoelectric conversion element according to claim 1,
wherein a negative electrode layer is laminated on a side opposite to the second layer across the first layer, and a positive electrode layer is laminated on a side opposite to the second layer across the third layer.

16. A light detection method comprising a step of detecting visible light and/or near infrared light from measurement result of a current flowing by making the second layer in the photoelectric conversion device according to claim 15 to receive visible light and/or near infrared light when a voltage is applied between the negative electrode layer and the positive electrode layer.

17. A production method for the photoelectric conversion element according to claim 1, the production method comprising:

a first step of forming a first laminate in which a first layer that is formed of a plurality of particles including an inorganic semiconductor as a main component, an aggregate of the particles, or a thin film including an inorganic semiconductor as a main component is laminated, on a surface of a substrate;

a second step of forming a second laminate in which a second layer that is formed of a plurality of particles including a perovskite structure as a main component, an aggregate of the particles, or a thin film including a perovskite structure as a main component is laminated, on an exposed surface of the first layer, and a third step of forming a third laminate in which a third layer that is formed of a plurality of particles including an organic metal complex as a main component, an aggregate of the particles, or a thin film including an organic metal complex as a main component is laminated, on an exposed surface of the second layer, wherein energy levels of the respective layers in a conduction band are higher in order of the first layer, the second layer, and the third layer, and an energy level of the second layer is higher than an energy level of the third layer in the valence bands of the respective layers, wherein the third step includes a step of forming a layer that is formed of a plurality of particles including an inorganic transition metal as a main component, an aggregate of the particles, or a thin film including an inorganic transition metal as a main component on the exposed surface of the second layer and subsequently forming a coordinate bond between the inorganic transition metal in the layer and an organic ligand.

* * * * *